(12) United States Patent
Yoshikawa et al.

(10) Patent No.: US 11,206,751 B2
(45) Date of Patent: Dec. 21, 2021

(54) MAGNETIC FIELD SHIELDING STRUCTURE

(71) Applicant: TOYOTA JIDOSHA KABUSHIKI KAISHA, Aichi-ken (JP)

(72) Inventors: Masayuki Yoshikawa, Toyota (JP); Kenichi Ichinose, Toyota (JP); Kazuhisa Ori, Toyota (JP); Hiroyuki Nishimura, Nagoya (JP); Hidetoshi Katoh, Toyota (JP)

(73) Assignee: TOYOTA JIDOSHA KABUSHIKI KAISHA, Aichi-Ken (JP)

( * ) Notice: Subject to any disclaimer, the term of this patent is extended or adjusted under 35 U.S.C. 154(b) by 0 days.

(21) Appl. No.: 17/103,779

(22) Filed: Nov. 24, 2020

(65) Prior Publication Data

US 2021/0161041 A1 May 27, 2021

(30) Foreign Application Priority Data

Nov. 27, 2019 (JP) .............................. JP2019-214752

(51) Int. Cl.
*H05K 9/00* (2006.01)
*H02K 11/01* (2016.01)

(52) U.S. Cl.
CPC ....... *H05K 9/0088* (2013.01); *H02K 11/0141* (2020.08); *H05K 9/0083* (2013.01)

(58) Field of Classification Search
CPC .................... H05K 9/0088; H02K 11/0141
See application file for complete search history.

(56) References Cited

U.S. PATENT DOCUMENTS

| | | | | |
|---|---|---|---|---|
| 3,888,260 | A * | 6/1975 | Fischell | A61N 1/365 607/36 |
| 2014/0015312 | A1 * | 1/2014 | Niizuma | E04H 6/42 307/9.1 |
| 2017/0232903 | A1 | 8/2017 | Saeki et al. | |
| 2018/0170192 | A1 * | 6/2018 | Yuasa | B60L 53/38 |

FOREIGN PATENT DOCUMENTS

| | | |
|---|---|---|
| JP | H5183290 A | 7/1993 |
| JP | H10313192 A | 11/1998 |
| JP | H11114153 A | 4/1999 |
| WO | 2016024331 A1 | 2/2016 |

\* cited by examiner

*Primary Examiner* — Hung V Ngo
(74) *Attorney, Agent, or Firm* — Hauptman Ham, LLP

(57) ABSTRACT

A magnetic field shielding structure includes a magnetic field generating source configured to generate a magnetic field. The magnetic field shielding structure further includes a shielding member that includes a pair of layers. The pair of layers includes a layer having high magnetic permeability, and a layer having low magnetic permeability laminated with the layer having high magnetic permeability. The layer having high magnetic permeability is closer to the magnetic field generating source than the layer having low magnetic permeability.

16 Claims, 10 Drawing Sheets

MAGNETIC FIELD SHIELDING STRUCTURE

CROSS-REFERENCE TO RELATED APPLICATION

This application is based on and claims priority under 35 USC 119 from Japanese Patent Application No. 2019-214752 filed on Nov. 27, 2019, the disclosure of which is incorporated by reference herein.

BACKGROUND

Technical Field

The present disclosure relates to a magnetic field shield structure that shields magnetism from a magnetic field generation source.

Background Art

In the magnetic field shield panel described in Japanese Patent Application (JP-A) No. H5-183290, plural high-permeability magnetic material plates having a required size are arranged to form a panel element having a required size. When the panel element is laminated in three layers, the adjacent joint portions of the magnetic material plates in each layer are laminated so as not to be linearly overlapped in the panel thickness direction. Then, an Al plate and a decorative plate are further laminated on the upper and lower surfaces of the laminated body. This prevents an increase in magnetic resistance due to a gap between adjacent joints of the magnetic material plates of the panel element layer. Further, as described above, preventing the deterioration of the magnetic field shield effect due to the deterioration of the alternating current magnetic characteristics due to the eddy current is possible.

In the above-mentioned reference, the positional relationship between the magnetic field shield panel and the magnetic field generation source is not specified. However, in order to enhance the magnetic field shielding effect, drawing the magnetic field lines leaking from the magnetic field generation source into the inside of the magnetic material plate which is the high magnetic permeability layer is important. By this drawing in the magnetic field lines leaking from the magnetic field generation source, the magnetic force lines flow in the in-plane direction of the high magnetic permeability layer, so that the magnetic energy can be efficiently attenuated. Further, by the above-described drawing in of the magnetic field lines leaking from the magnetic field generation source, the magnetic field lines can be guided in a direction away from the protection target. However, the above-mentioned reference does not fully consider the above-mentioned draw in.

SUMMARY

In consideration of the above facts, the present disclosure aims to obtain a magnetic field shielding structure capable of efficiently drawing-in the lines of magnetic force leaking from the magnetic field generating source inside the high magnetic permeability layer.

The vehicle occupant protection device according to at least one aspect of the present disclosure includes a magnetic field generating source and a shielding member. The magnetic field generating source configured to generate a magnetic field. The shielding member has a pair of layers, the pair of layers including a layer having high magnetic permeability, and a layer having low magnetic permeability which are laminated with the layer having high magnetic permeability. The layer having high magnetic permeability is closer to the magnetic field generating source than the layer having low magnetic permeability.

In at least one aspect, the "layer having high magnetic permeability" is a soft magnetic material, such as iron or permalloy, made into a foil-like layer. Alternatively, the "layer having high magnetic permeability" is a layer formed from a resin that is mixed with a fine powder of a soft magnetic material. Further, in at least one aspect, the "layer having low magnetic permeability" is a layer formed from a non-magnetic material such as a resin.

In at least one aspect, the shielding member having a pair of layers, which includes a layer having high magnetic permeability and a layer having low magnetic permeability which are laminated. The layer having high magnetic permeability is closer to the magnetic field generating source than the layer having low magnetic permeability. Lines of magnetic force that leak from the magnetic field generating source and enter the layer having high magnetic permeability are unlikely to pass through the layer having low magnetic permeability. Therefore, the lines of magnetic force easily flow in the in-plane direction of the sheet having high magnetic permeability. As a result, the lines of magnetic force can be efficiently drawn into the layer having high magnetic permeability.

In the magnetic field shielding structure according to at least one aspect of the present disclosure, the shielding member includes multiple pairs of the layers, each of the multiple pairs being laminated, and the pair of layers is one of the plurality of pairs of layers.

In at least one aspect, the shielding member includes multiple pairs of a layer having high magnetic permeability and a layer having low magnetic permeability, each of the multiple pairs being laminated. That is, the shielding member has a structure in which layers having high magnetic permeability and layers having low magnetic permeability layers are alternately laminated. As a result, the lines of magnetic force that leak from the magnetic field generating source and try to pass through, that is, penetrate the shielding member can be effectively attenuated by the multiple pairs of the layers.

In the magnetic field shielding structure according to at least one aspect of the present disclosure, the shielding member includes a notch on the side of the shielding member closer to the magnetic field generating source.

The notch may be an opening or an incision that opens toward the magnetic field generating source. Alternatively, the notch may have a closed opening as viewed from the magnetic field generating source.

In at least one aspect, the shielding member, which has multiple pairs of a layer having high magnetic permeability and a layer having low magnetic permeability, each of the multiple pairs being laminated, includes a notch on a side of the shielding member closest to the magnetic field generating source. As a result, the lines of magnetic force can also be efficiently drawn through the above-mentioned notch into the inside of the layer having high magnetic permeability of the pair of layers positioned on the side opposite to the magnetic field generating source with respect to the pair of the layers that is positioned closest to the magnetic field generating source.

In the magnetic field shielding structure according to at least one aspect of the present disclosure, a pair of layers, of the plurality of pairs of layers, which is farthest from the magnetic field generating source, does not include any part of the notch.

According to at least one aspect, the pair of layers, of the plurality of pairs of layers, which is farthest from the magnetic field generating source, does not include any part of the notch. As a result, drawing-in of lines of magnetic force to the layer having high magnetic permeability of the pair of the layers that is positioned farthest from the magnetic field generating source can be facilitated by the notch. In addition, the layer having low magnetic permeability of the pair of the layers that is positioned farthest from the magnetic field generating source can suppress the transmission of the lines of magnetic force.

In the magnetic field shielding structure according to at least one aspect of the present disclosure, at the notch, cut surfaces of at least one pair of the layers, of the plurality of pair of layers, are exposed.

According to at least one aspect, at the notch, cut surfaces of at least one pair of the layers, of the plurality of pair of layers, are exposed. Thereby, the lines of magnetic force can be drawn, from the cut surfaces, into the inside of the layer having high magnetic permeability layer included in the at least one pair of the layers. As a result, improving the efficiency of drawing-in lines of magnetic force is possible.

In the magnetic field shielding structure according to at least one aspect of the present disclosure, at the notch, the at least one pair of the layers is bent toward the magnetic field generating source.

According to at least one aspect, at the notch, at least one pair of the layers is bent toward the magnetic field generating source. As a result, the cut surfaces of the bent pair of the layers is directed toward the magnetic field generating source. As a result, further improvement of the efficiency of drawing-in lines of magnetic force from the cut surfaces is possible.

In the magnetic field shielding structure according to at least one aspect of the present disclosure, a pair of layers, of the plurality of pair of layers, that is farthest from the magnetic field generating source does not include any part of the notch, and the notch opens toward the magnetic field generating source.

According to at least one aspect, the pair of layers that is farthest from the magnetic field generating source does not include any part of the notch, and the notch opens toward the magnetic field generating source. As a result, drawing-in of lines of magnetic force to the layer having high magnetic permeability of the pair of the layers that is positioned farthest from the magnetic field generating source can be facilitated by the opening. Moreover, the transmission of the lines of magnetic force can be blocked by the layer having low magnetic permeability of the pair of the layers that is positioned farthest from the magnetic field generating source.

In the magnetic field shielding structure according to at least one aspect of the present disclosure, the at least one pair of the layers extends toward the magnetic field generating source at an end portion of the notch.

According to at least one aspect, at least one pair of the layers extends toward the magnetic field generating source at an end portion of the notch that opens toward the magnetic field generating source in the shielding member. The cut surfaces of the extended pair of layers is directed toward the magnetic field generating source. As a result, further improvement of the efficiency of drawing-in lines of magnetic force from the cut surfaces is possible.

In the magnetic field shielding structure according to at least one aspect of the present disclosure, the magnetic field generating source is a motor. Further, the notch extends in a rotation axis direction of the motor.

According to at least one aspect, the notch extends in the rotation axis direction of the motor. As a result, leaked lines of magnetic force that disperse in the rotation axis direction of the motor can be efficiently drawn into the inside of the shielding member from the notch.

In the magnetic field shielding structure according to at least one aspect of the present disclosure, the magnetic field generating source is mounted on a movable body configured to carry an occupant. Further, the shielding member is between a location for the occupant and the magnetic field generating source.

In at least one aspect, the shielding member is between the location for the occupant and the magnetic field generating source that is mounted on the movable body configured to carry the occupant. This shielding member is the one described in at least one aspect. Therefore, line of magnetic force that leak from the magnetic field generating source can be efficiently drawn into a layer having high magnetic permeability. As a result, the influence of the magnetic field on the occupant can be effectively suppressed.

In the magnetic field shielding structure according to at least one aspect of the present disclosure, the movable body is a vehicle that is equipped with a seat for the occupant. The magnetic field generating source is a motor that is disposed diagonally downward of a vehicle rear of the seat with a vehicle width direction being a rotation axis direction of the motor. The shielding member includes multiple pairs of the layers, each of the multiple pairs being laminated, the pair of layers is one of the plurality of pairs of layers, and includes a notch on the side of the shielding member closest to the magnetic field generating source. In the shielding member, as viewed from the vehicle width direction, the notch is on a virtual straight line that connects a center of the motor and a hip point of the occupant.

In at least one aspect, a motor, which is a magnetic field generating source, is provided to a vehicle that is equipped with a seat for the occupant. This motor is disposed diagonally downward of a vehicle rear of the seat with a vehicle width direction being a rotation axis direction of the motor. The shielding member described in at least one aspect is disposed between the motor and the occupant. This shielding member has a configuration in which the above-described multiple pairs of layers are laminated. The shielding member includes a notch on the side of the shielding member closest to the magnetic field generating source side. The notch, as viewed from the vehicle width direction, positioned on a virtual straight line that connects a center of the motor and a hip point of the occupant. As a result, lines of magnetic force that leak from the motor and head toward the occupant can be efficiently drawn into the inside of the shielding member from the notch.

As explained above, in the magnetic field shielding structure according to the present disclosure, lines of magnetic force that leaking from a magnetic field generating source can be efficiently drawn into a layer having high magnetic permeability.

BRIEF DESCRIPTION OF THE DRAWINGS

Exemplary embodiments of the present disclosure will be described in detail based on the following figures, wherein.

DETAILED DESCRIPTION

Hereinafter, the magnetic field shield structure 10 according to at least one embodiment of the present disclosure will be described with reference to FIG. 1 to FIG. 5. One of ordinary skill in the art would understand that an arrow FR and an arrow UP, which are appropriately described in each drawing, respectively indicate a front direction (a traveling direction) and an upward direction of a vehicle to which the magnetic field shield structure 10 is applied. Hereinafter, when description is given by merely using longitudinal and vertical directions, these refer to the longitudinal of the vehicle longitudinal direction and the vertical of the vehicle vertical direction, unless otherwise specified.

(Structure)

Figure 1:
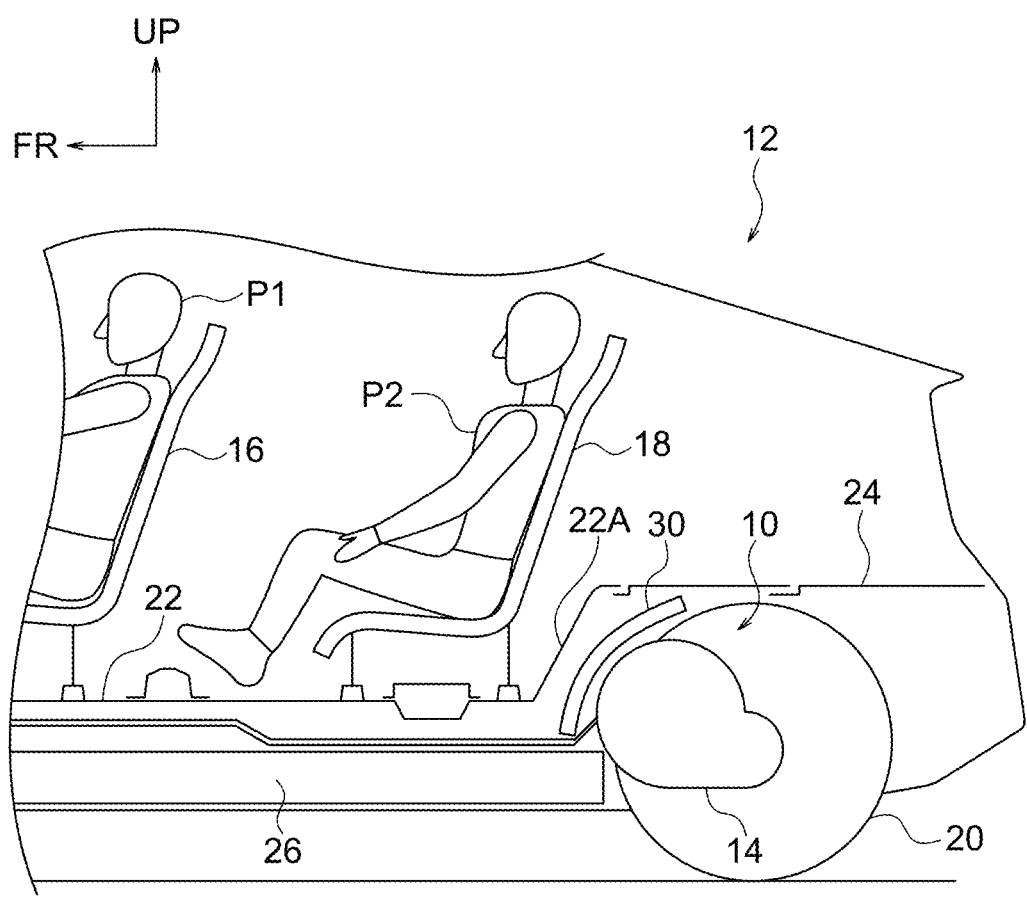
FIG. 1 is a cross-sectional view of a vehicle to which a magnetic field shield structure according to at least one embodiment of the present disclosure is applied, as seen from the vehicle width direction.

As shown in FIG. 1, the magnetic field shield structure 10 according to at least one embodiment of the present disclosure is applied to a vehicle 12 equipped with a motor 14 that is a magnetic field generation source and an electromagnetic wave generation source. The vehicle 12 is, for example, a hatchback type electric vehicle having front seats 16 and rear seats 18. The vehicle 12 is capable of traveling (that is, capable of moving) with an occupant P1 seated in the front seat 16 and an occupant P2 seated in the rear seat 18. The vehicle 12 corresponds to the "moving body" in the present disclosure. The rear seat 18 is a feature that corresponds to the "seat" according to this disclosure.

The motor 14 is a power unit for driving the vehicle 12. The motor 14 is arranged diagonally downward and rearward of the vehicle with respect to the rear seat 18, that is, at the rear of the vehicle 12. The motor 14 is arranged such that the vehicle width direction is the direction of the rotation axis RA of the rotor (not shown). Note that, in FIG. 1, the direction perpendicular to the paper surface is the vehicle width direction. Further, the reference numerals of the rotation axis RA are omitted except for in FIG. 2. Hereinafter, the direction of the rotation axis RA of the rotor will be simply referred to as the "rotation axis direction of the motor 14". Note that, in FIG. 1, 20 is a rear tire, 22 is a floor panel, and 24 is a luggage floor panel. At the rear end of the floor panel 22, an inclined portion 22A that is inclined upward toward the rear of the vehicle is provided. The front end of the luggage floor panel 24 is connected to the upper end of the inclined portion 22A. The above-described motor 14 is arranged diagonally below and behind the vehicle with respect to the inclined portion 22A and below the front portion of the luggage floor panel 24. A battery 26 for supplying electric power to the motor 14 is arranged below the floor panel 22.

A shielding sheet 30 that is a shielding member is arranged between the motor 14 and the occupant P2 of the rear seat 18. In addition, the shielding sheet 30 is schematically illustrated in FIG. 1. The shielding sheet 30 is a shield material for protecting the occupant P2 from the magnetic field generated by the motor 14. The shielding sheet 30 has a sheet shape that is curved substantially concentrically with the motor 14. The sheet shape is synonymous with the plate shape. The shielding sheet 30 is curved so as to be convex toward the front diagonal upper side of the vehicle when viewed from the vehicle width direction. The shielding sheet 30 is arranged diagonally downward and rearward of the vehicle with respect to the inclined portion 22A of the floor panel 22. The shielding sheet 30 faces the motor 14 from the diagonally upper front side of the vehicle.

Figure 2:
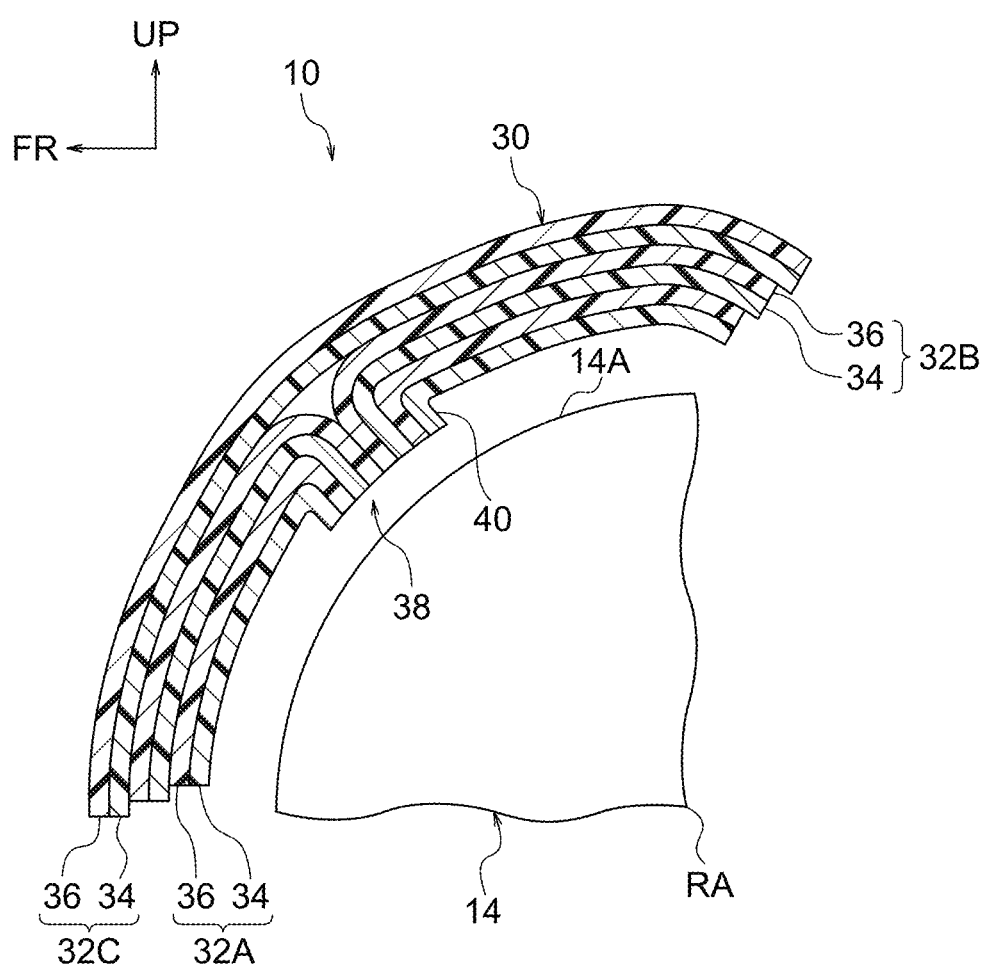
FIG. 2 is an enlarged sectional view showing a part of the configuration in FIG. 1 in an enlarged manner.

As shown in FIG. 2, the shielding sheet 30 has plural (three in this case) pair layers 32A, 32B, and 32C each configured by laminating a sheet 34 having a high magnetic permeability and a sheet 36 having a low magnetic permeability. The plural pair layers 32A, 32B, and 32C are laminated. The sheet 34 having a high magnetic permeability constitutes the "layer having high magnetic permeability" of the present disclosure. The sheet 36 having a low magnetic permeability constitutes the "layer having low magnetic permeability" of the present disclosure. Hereinafter, the pair layers 32A, 32B, and 32C may be simply referred to as "pair layers 32". In this shielding sheet 30, the sheets 34 having high magnetic permeability and the sheets 36 having low magnetic permeability are alternately laminated. Note that the number of pair layers 32 laminated in the shielding sheet 30 is preferably 3 or more, but may be less than 3. The "layer having high magnetic permeability" in the present disclosure may be a laminate of plural sheets having a high magnetic permeability. The "layer having low magnetic permeability" in the present disclosure may be a laminate of plural sheets having a low magnetic permeability. That is, the "pair layer" in the present disclosure may be, for example, a laminate of two sheets having a low magnetic permeability and one sheet having a high magnetic permeability. Further, for example, the "pair layer" in the present disclosure may be a laminate of one sheet having a low magnetic permeability and two sheets having a high magnetic permeability.

The sheet 34 having a high magnetic permeability is a foil-like sheet made of a soft magnetic material such as iron or permalloy. Alternatively, the sheet 34 having a high magnetic permeability is, for example, made of a resin, in which a fine powder of a soft magnetic material is mixed, that processed into a flexible sheet. The sheet 36 having a low magnetic permeability is, for example, made of a non-magnetic material, such as a resin, that is processed into a flexible sheet. The shielding sheet 30, having a structure in which the sheets 34 having a high magnetic permeability and the sheets 36 having a low magnetic permeability are alternately laminated, has flexibility and softness. The shielding sheet 30 can be appropriately bent and used in accordance with the shapes of the floor panel 22, which is a body panel, the motor 14, and the like.

In the shielding sheet 30, the pair layers 32A, 32B, and 32C are arranged such that the sheets 34 having a high magnetic permeability are arranged on the motor 14 side with respect to the sheets 36 having a low magnetic permeability. The shielding sheet 30 is curved along the outer peripheral surface 14A of the motor 14 (see FIG. 2). In this shielding sheet 30, the sheet 34 having a high magnetic permeability of the pair layer 32A located closest to the motor 14 faces the outer peripheral surface 14A of the motor 14. This shielding sheet 30 is attached to the motor 14 or the floor panel 22 directly or via a bracket (not shown). Note that a reinforcing sheet may be further laminated on the motor 14 side with respect to the sheet 34 having a high magnetic permeability located closest to the motor 14 side.

As shown in FIG. 2, a notch 38, which is cut from the motor 14 side, is formed in the central portion of the shielding sheet 30 as viewed in the vehicle width direction. The notch 38 is a cut section. The notch 38 is formed in the pair layer 32A that is located closest to the motor 14 and in the intermediate pair layer 32B that is stacked on the occupant P2 side of the pair layer 32A. The notch 38 does not reach the pair layer 32C that is located on the most occupant P2 side, that is, the most opposite side to the motor 14. That is, the notch 38 is not formed in the pair layer 32C. Note that the above "cut" does not limit the method of forming the notch 38, but merely specifies the shape of the notch 38. The notch 38 may have a cut on at least the surface of the shielding sheet 30 on the motor 14 side. In the present embodiment, the notch 38 has a configuration in which its mouth is closed when viewed from the motor 14 side. The notch 38 may be an opening or an incision opened on the motor 14 side. In the following description, the pair layer 32A that is located closest to the motor 14 may be referred to as a "motor side pair layer 32A". Further, in the following description, the intermediate pair layer 32B may be referred to as an "intermediate pair layer 32B". Furthermore, in the following description, the pair layer 32C that is located closest to the occupant P2 may be referred to as an "occupant side pair layer 32C".

In the notch 38, the motor side pair layer 32A and the intermediate pair layer 32B are cut or divided in the circumferential direction of the motor 14. In the notch 38, the cut surfaces of the motor side pair layer 32A and the intermediate pair layer 32B are exposed to the motor 14 side. Specifically, the motor side pair layer 32A and the intermediate pair layer 32B are bent toward the motor 14 side on both sides of the notch 38, that is, on both edges of the notch 38. In the present embodiment, as an example, the motor side pair layer 32A and the intermediate pair layer 32B are bent at both edges of the notch 38. As a result, bent portions 40 projecting toward the motor 14 side are formed at both edges of the notch 38. In the bent portion 40, the cut surfaces of the motor side pair layer 32A and the intermediate pair layer 32B are oriented to the motor 14 side. In addition, only the motor side pair layer 32A may be bent toward the motor 14 side on both sides of the notch 38. Further, in the present embodiment, the bent portion 40 projects from the surface of the shielding sheet 30 on the motor 14 side, but the disclosure is not limited to this. The bent portion 40 may not protrude from the surface of the shielding sheet 30 on the motor 14 side.

Figure 3:
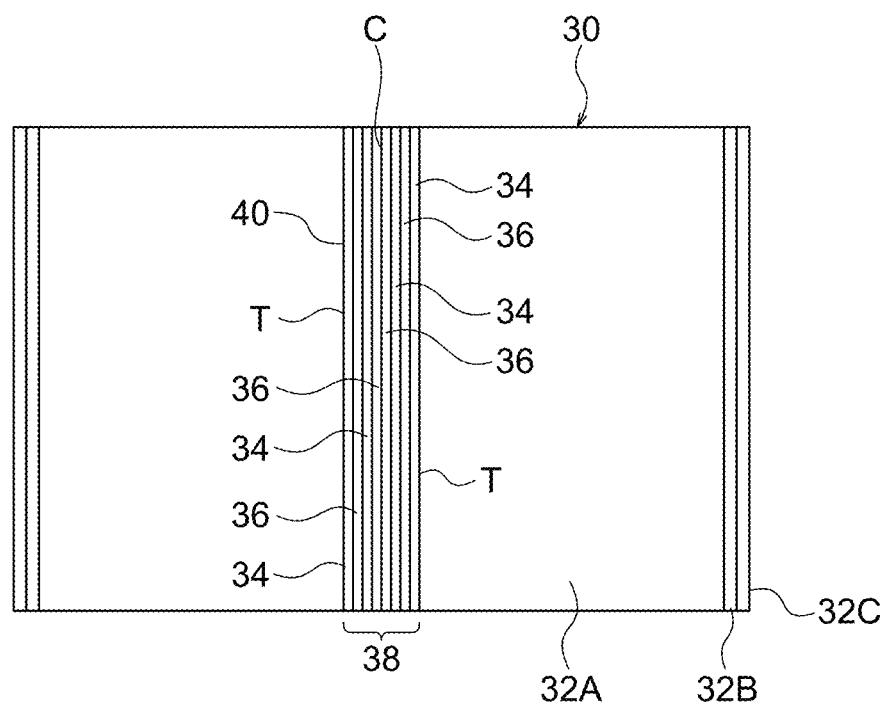
FIG. 3 is a Plane developed view of a shielding sheet that is a shielding member.

The notch 38 is not open to the motor 14 side. In the sheet 36 having a low magnetic permeability of the intermediate pair layer 32B, the portions on both sides of the notch 38 are bent as described above and are in contact with each other. As shown in FIG. 3, the notch 38 is formed in a long shape and a linear shape. The notch 38 extends in the rotation axis direction of the motor 14, that is, the vehicle width direction. Note that the cutout 38 may be opened to the motor 14 side, that is, the incision opened to the motor 14 side may be formed in the shielding sheet 30.

Figure 4:
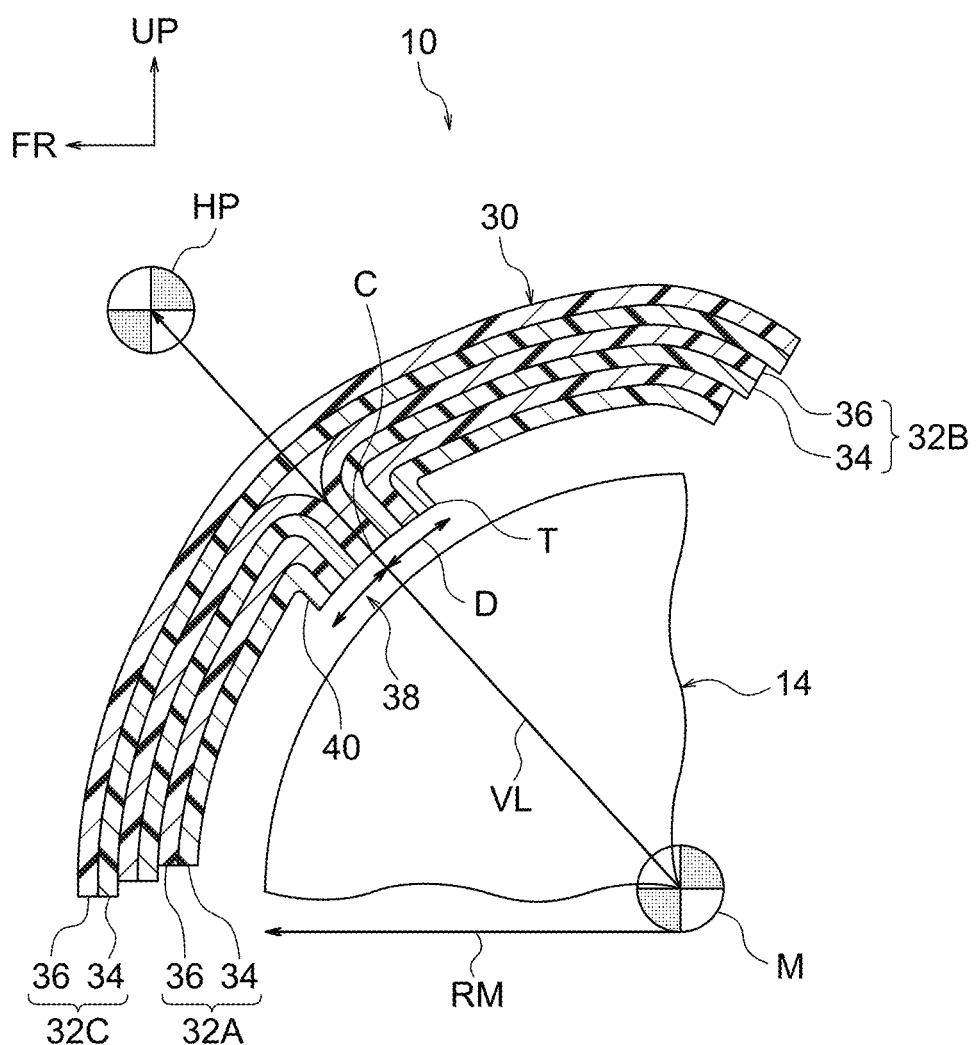
FIG. 4 is a view corresponding to FIG. 2 including an arrangement of the notch.

Further, as shown in FIG. 4, when viewed from the vehicle width direction, the center C of the notch 38 is located on a virtual straight line VL that connects the center M of the motor 14 and the hip point HP of the occupant P2. The motor 14 is a magnetic field generation source, and the occupant P2 is a shielding target. Further, in the motor side pair layer 32A and the intermediate pair layer 32B, the distance D from the end portion T of the portion bent toward the motor 14 side in the vehicle width direction to the center C of the notch 38 is set to the value specified by the following equation (1).

$$D=2\pi R_M/(2P_N) \qquad (1)$$

In the above formula (1), $R_M$ is the radius of the motor 14 and $P_N$ is the number of poles of the motor 14. By defining the distance D as in the equation (1), the leakage magnetic force lines LM shown in FIG. 5 can be largely covered by the notch 38. These leakage magnetic force lines LM are magnetic force lines that leak from the motor 14 in the radial direction and heads move toward the occupant P2.

(Operation and Effects)
Operation and effects of the present embodiment are described next.

Figure 5:
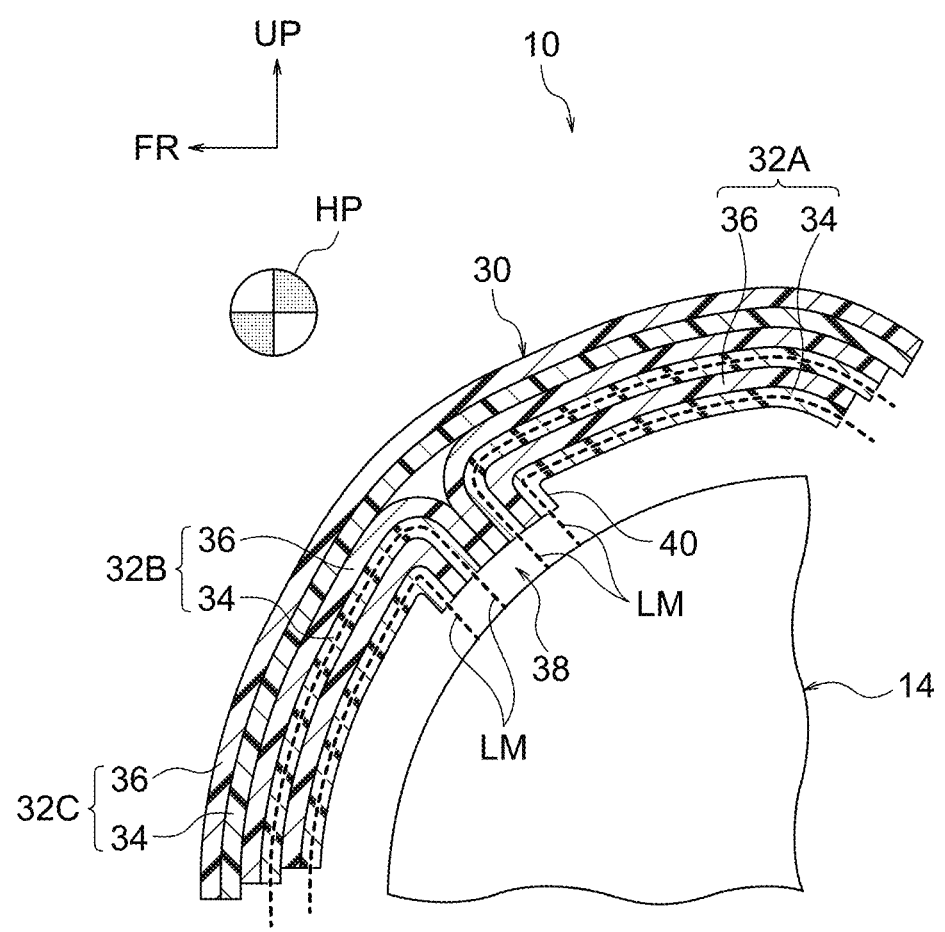
FIG. 5 is a view corresponding to FIG. 2 including an attraction of magnetic force lines.

In the present embodiment, the shielding sheet 30 having the pair layer 32 in which the sheet 34 having a high magnetic permeability and the sheet 36 having a low magnetic permeability are laminated is arranged to face the motor 14 that is the magnetic field generation source. The shielding sheet 30 is arranged such that the sheet 34 having a high magnetic permeability is located on the motor 14 side with respect to the sheet 36 having a low magnetic permeability. As shown in FIG. 5, the magnetic lines of force LM leaking from the motor 14 and entering the sheets 34 having a high magnetic permeability are unlikely to pass through the sheets 36 having a low magnetic permeability. Therefore, the magnetic force lines LM easily flow in the in-plane direction of the sheets 34 having a high magnetic permeability. As a result, the magnetic force lines LM can be efficiently drawn into the sheets 34 having a high magnetic permeability.

Further, in the present embodiment, the shielding sheet 30 has a configuration in which plural pair layers 32 of a sheet 34 having a high magnetic permeability and a sheet 36 having a low magnetic permeability are laminated, that is, a configuration in which sheet 34 having a high magnetic permeability and sheet 36 having a low magnetic permeability are alternately laminated. As a result, the magnetic force lines LM that leak from the motor 14 and try to permeate, that is, penetrate the shielding sheet 30 can be effectively attenuated by the pair layers 32A, 32B, and 32C that are the plural pair layers 32.

Further, in the present embodiment, the shielding sheet 30 having a configuration in which plural pair layers 32 of the sheet 34 having a high magnetic permeability and the sheet 36 having a low magnetic permeability are laminated has a notch 38 cut from the motor 14 side. As a result, the magnetic force lines LM can be efficiently drawn through the notches 38 also inside the sheets 34 having a high magnetic permeability of the pair layers 32B and 32C located closer to the occupant P2 than the motor side pair layer 32A.

Further, the cutout portion 38 does not reach the passenger side pair layer 32C. As a result, promoting the drawing of the magnetic force lines LM into the sheet 34 having a high magnetic permeability of the occupant-side pair layer 32C by the notches 38 is possible. In addition, the sheet 36 having a low magnetic permeability of the pair layer 32C can suppress the transmission of the magnetic force lines LM.

In addition, in the present embodiment, the cut surfaces of the motor side pair layer 32A and the intermediate pair layer 32B are exposed in the above-mentioned notch 38. As a result, the magnetic force lines LM can be drawn, from the above-mentioned cut surface, into the inside of the sheets 34 having a high magnetic permeability included in the motor-side pair layer 32A and the intermediate pair layer 32B. As a result, the efficiency of drawing the magnetic force lines LM to the inside is improved.

Further, in the present embodiment, the motor side pair layer 32A and the intermediate pair layer 32B are bent toward the motor 14 side in the cutout portion 38. Further, the cut surfaces of the bent pair layers 32A and 32B are oriented to the motor 14 side. As a result, the efficiency of drawing the magnetic force lines LM from the cut surface is further improved.

Further, in the present embodiment, the notch 38 cut from the motor 14 side with respect to the shielding sheet 30 extends in the rotation axis direction of the motor 14, that is, in the vehicle width direction here. As a result, the leakage magnetic force lines LM distributed in the rotation axis direction of the motor 14 can be efficiently drawn into the inside of the shielding sheet 30 from the above-mentioned cutout portion 38.

Further, in the present embodiment, the above-mentioned motor 14 is mounted on the vehicle 12 that is capable of carrying the occupants P1 and P2. The shielding sheet 30 is arranged between the occupant P2 and the motor 14. The magnetic force lines LM leaking from the motor 14 can be efficiently drawn into the sheets 34 having a high magnetic permeability of the shielding sheet 30. As a result, the influence of the magnetic field of the motor 14 on the occupant P2 can be effectively suppressed.

Moreover, in the present embodiment, the motor 14 of the vehicle 12 is arranged diagonally below the vehicle rearward of the rear seat 18 with the vehicle width direction as the rotation axis direction. A shielding sheet 30 is arranged between the motor 14 and the occupant P2. The shielding sheet 30 has a notch 38 cut from the motor 14 side. Further, when viewed from the vehicle width direction, the center C of the notch 38 is located on a virtual straight line VL that connects the center M of the motor 14 and the hip point HP of the occupant P2. As a result, the magnetic force lines LM that leak from the motor 14 and head toward the occupant P2 can be efficiently drawn into the inside of the shielding sheet 30 from the notch 38.

Figure 6:
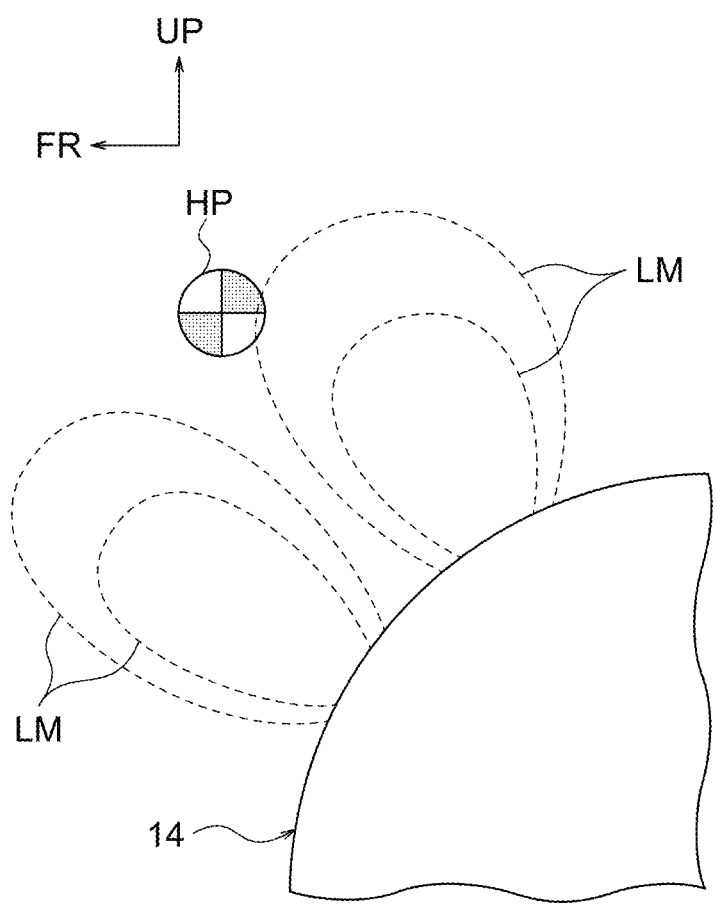
FIG. 6 is a diagram corresponding to FIG. 2 including a distribution of magnetic force lines in a case in which a shielding sheet is not provided.

The above effects will be further explained. When the shielding member or the shielding material such as the shielding sheet 30 is not mounted on the vehicle 12, the magnetic force lines LM leaking from the motor 14 are distributed as shown in FIG. 6. That is, the magnetic force lines LM are distributed in an arc so as to be convex in the direction of the occupant P2. A shielding sheet 30 is mounted on the vehicle 12 to prevent the magnetic force lines LM from being directed toward the occupant P2. In that case, guiding the magnetic force lines LM in the in-plane direction of the shielding sheet 30, that is, in the direction orthogonal to the thickness direction of the shielding sheet 30, is important.

In this respect, the shielding sheet 30 in the present embodiment has a configuration in which the sheets 34 having a high magnetic permeability and the sheets 36 having a low magnetic permeability are alternately laminated. As a result, the magnetic force lines LM penetrating the shielding sheet 30 can be reduced by the sheets 36 having a low magnetic permeability. In addition, the magnetic force lines LM can be provided with directivity so that the magnetic force lines LM flow in the in-plane direction of the sheets 34 having a high magnetic permeability.

Moreover, the shielding sheet 30 has the above-mentioned notch 38. The motor side pair layer 32A and the intermediate pair layer 32B are bent toward the motor 14 side in the cutout portion 38. As a result, the in-plane direction of the sheets 34 having a high magnetic permeability included in the motor side pair layer 32A and the intermediate pair layer 32B can be aligned with the direction of the magnetic force line LM in the notch 38. Thereby, the magnetic force lines LM can be efficiently guided in the plane of each of the sheets 34 having a high magnetic permeability. As a result, the magnetic force lines LM heading toward the occupant P2 side can be efficiently reduced, and the shielding effect can be enhanced.

Figure 7:
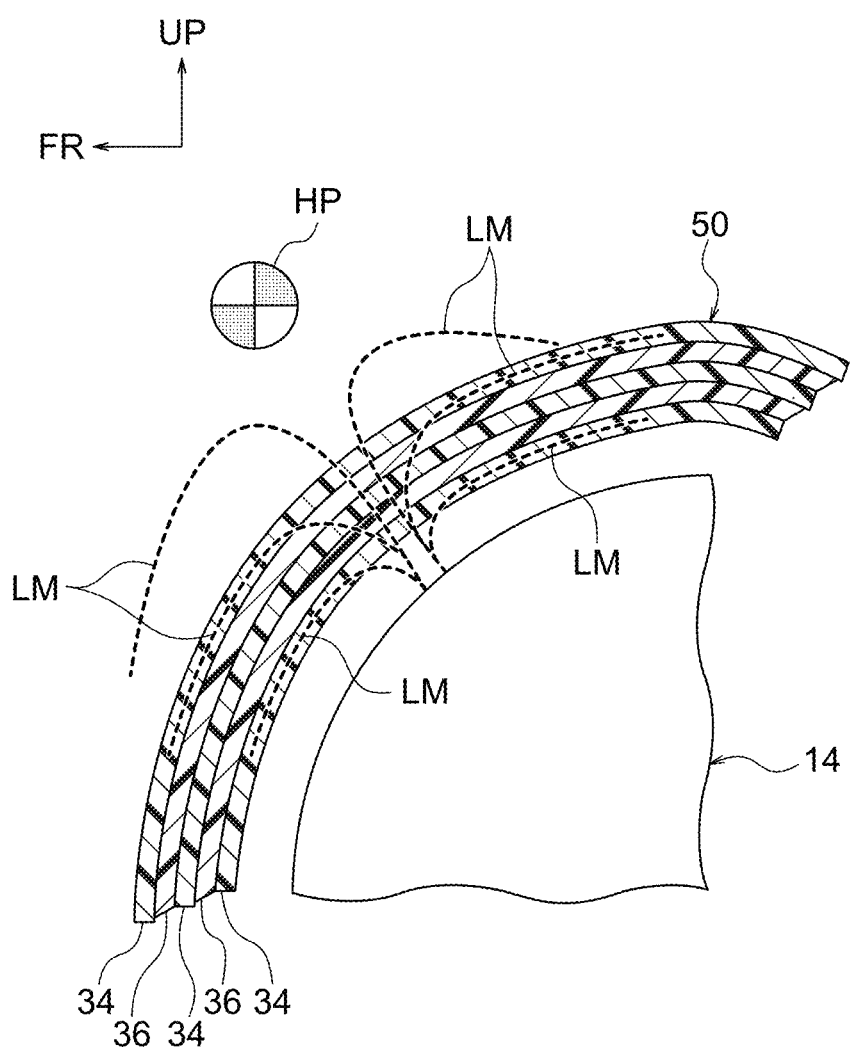
FIG. 7 is a diagram corresponding to FIG. 5 according to at least one embodiment of the present disclosure.

In addition, in the aforementioned embodiment, although the shielding sheet 30 has a configuration including the notch 38, other configurations are possible. As in the modified example shown in FIG. 7, the shielding sheet 50, which is a shielding member, may be configured so as not to have the notch 38. Also in this modified example, the magnetic force lines LM penetrating the shielding sheet 50 can be reduced by the sheets 36 having a low magnetic permeability while the magnetic force lines LM can be guided in the in-plane direction of the sheets 34 having a high magnetic permeability.

Further, in at least one embodiment, although the notch 38 of the shielding sheet 30 is formed in the motor side pair layer 32A and the intermediate pair layer 32B, but not formed in the occupant side pair layer 32C, other configurations are possible. The occupant side pair layer 32C may have a configuration in which the notch 38 is formed, that is, the occupant side pair layer 32C may be cut by the notch 38. In that case, for example, the pair layers 32A, 32B, 32C are bent toward the motor 14 on both sides via the notch 38, and the cut surfaces of the pair layers 32A, 32B, 32C are directed toward the motor 14 side. Further, in the sheets 36 having a low magnetic permeability of the occupant side pair layer 32C, the portions on both sides of the notch 38 are bent as described above and brought into contact with each other to be in close contact with each other.

Next, another embodiment of the present disclosure will be described. Note that configuration and operation that are basically the same as in the aforementioned embodiment are appended with the same reference numerals as in the aforementioned embodiment, and explanation thereof is omitted.

Figure 8:
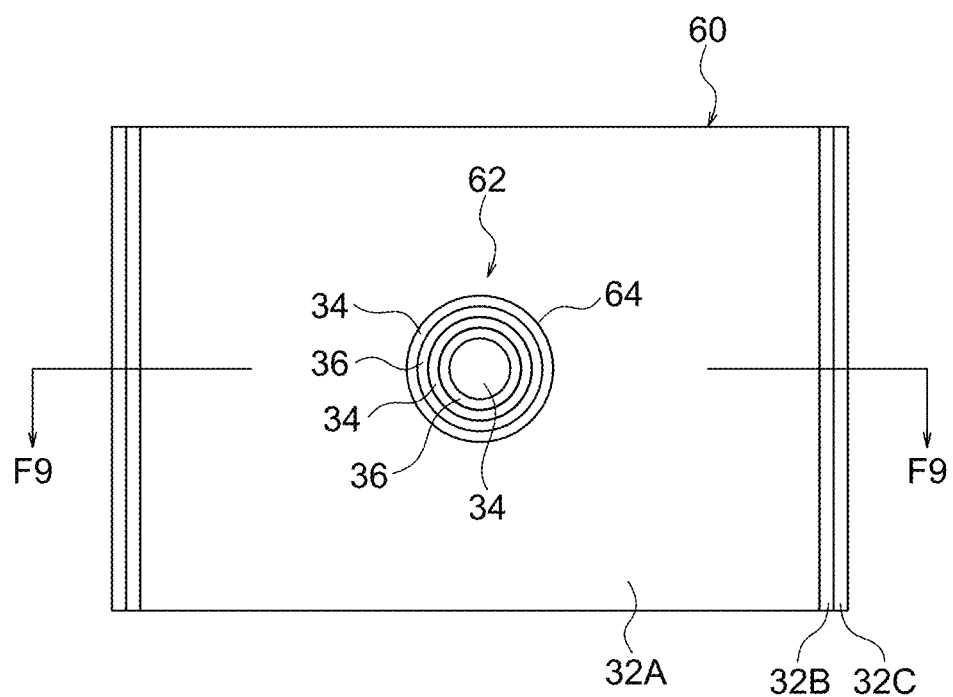
FIG. 8 is a diagram corresponding to FIG. 3 according to at least one embodiment of the present disclosure.

FIG. 8 shows a shielding sheet 60 as a shielding member included in the magnetic field shield structure according to at least one embodiment of the present disclosure in a development view corresponding to FIG. 3. Further, in FIG. 9, a cross section taken along line F9-F9 of FIG. 8 is shown in an enlarged sectional view that is enlarged. In this embodiment, an opening 62, as a notch, is formed in the central portion of the shielding sheet 60. The opening 62 has a circular shape when viewed from the thickness direction of the shielding sheet 60, that is, the direction perpendicular to the paper surface in FIG. 8. Note that the shape of the opening 62 is not limited to the circular shape. For example, the opening 62 may be configured to have a rectangular shape or an elliptical shape when viewed from the thickness direction of the shielding sheet 60. The opening 62 is on the magnetic source side (not shown), that is, on the front side of the paper surface in FIG. 8, and is cut from the lower side in FIG. 9. The opening 62 is formed in the pair layer 32A closest to the magnetic source side and the intermediate pair layer 32B adjacent to the pair layer 32A. This opening portion 62 does not reach the pair layer 32C located on the opposite side to the side closest to the magnetic source. The magnetic source is, for example, a motor of a vehicle air conditioner (not shown) that is arranged in an instrument panel (not shown) of the vehicle 12. The shielding sheet 60 is arranged between the motor and the occupant P1 (not shown in FIGS. 8 and 9).

At the edge of the opening 62, the pair layers 32A and 32B are raised to the side of the magnetic field generation source. As a result, a rising portion 64 projecting toward the magnetic generation source side is formed at the edge of the opening 62. The rising portion 64 is formed by, for example, a burring processing. The rising portion 64 projects from the surface of the shielding sheet 60 on the magnetic field generation source side. In the rising portion 64, the pair layers 32A and 32B are erected in a tubular shape. The tubular portion of the pair layer 32B is fitted inside the tubular portion of the pair layer 32A. Further, a part of the sheet 34 having a high magnetic permeability included in the pair layer 32C closest to the occupant P1 side is exposed to the magnetic field generation source side through the opening 62.

Figure 9:
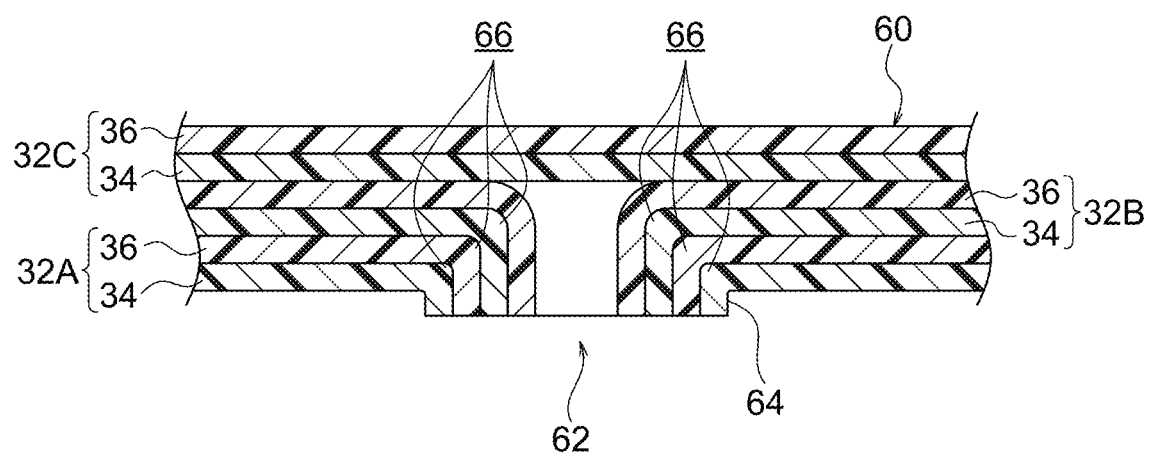
FIG. 9 is an enlarged cross-sectional view showing an enlarged cross section taken along line F9-F9 of FIG. 8.

In addition, at the tip of the rising portion 64, the cut surfaces of the pair layers 32A and 32B are exposed to the magnetic field generation source side, that is, face the magnetic field generation source. In the rising portion 64, the in-plane direction of the pair layer 32A and the pair layer 32B is along the direction of the magnetic force lines leaking from the magnetic field generation source. It should be noted that it is difficult to burr the sheets 34 having a high magnetic permeability and the sheets 36 having a low magnetic permeability at an acute angle on the rising portion 64. Therefore, a space 66 as shown in FIG. 9 may arise between the sheets 34 having a high magnetic permeability and the sheets 36 having a low magnetic permeability.

Also in this embodiment, the magnetic force lines LM that leak from the magnetic field generation source and enter the sheets 34 having a high magnetic permeability are unlikely to pass through the sheets 36 having a low magnetic permeability. Therefore, the magnetic force lines LM easily flow in the in-plane direction of the sheets 34 having a high magnetic permeability. As a result, the magnetic force lines LM can be efficiently drawn into the sheets 34 having a high magnetic permeability.

Moreover, in this embodiment, the opening 62 formed in the shielding sheet 60 is open to the magnetic field generation source side. As a result, the opening 62 can effectively promote the drawing of the magnetic force lines to the sheet 34 having a high magnetic permeability of the pair layer 32C located at the opposite side to closest side to the magnetic field generation source. In addition, the sheet 36 having a low magnetic permeability of the pair layer 32C can block the transmission of the magnetic force lines LM.

Further, in this embodiment, the pair layers 32A and 32B are raised to the magnetic field generation source side at the edge of the opening 62. The cut surfaces of the raised pair layers 32A and 32B are exposed to the magnetic field generation source side. As a result, the magnetic force lines can be efficiently guided from the cut surfaces in the in-plane direction of the sheets 34 having a high magnetic permeability of the pair layers 32A and 32B. As a result, it is possible to further improve the efficiency of drawing the magnetic force lines into the shielding sheet 60. As a result, more effectively reduce the lines of magnetic force toward the occupant P1 side is possible.

Figure 10:
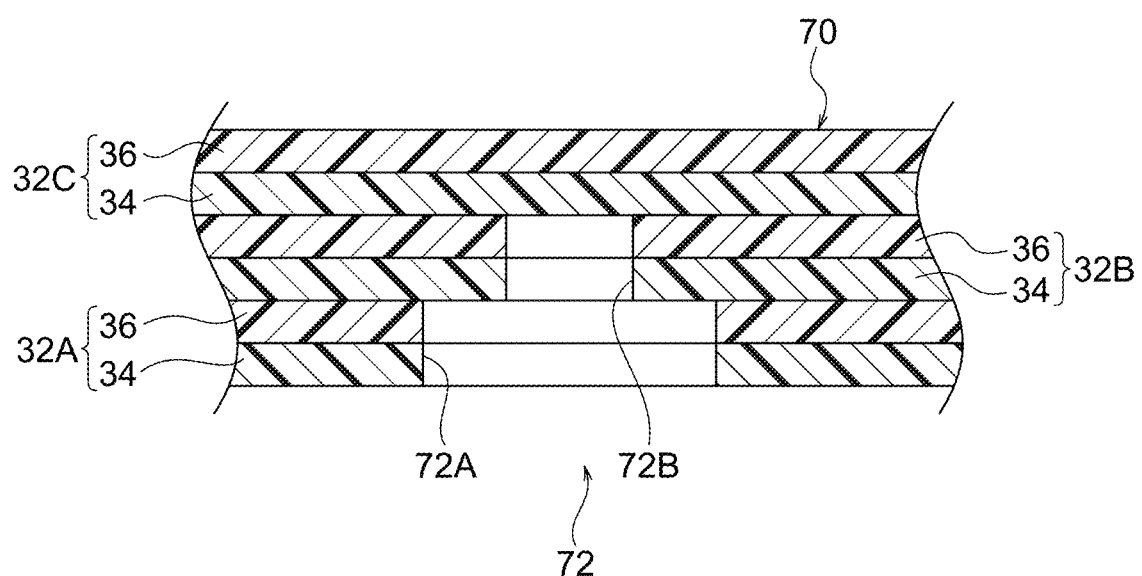
FIG. 10 is a cross-sectional view showing a partial configuration of the shielding sheet according to at least one embodiment of the present disclosure.

FIG. 10 is a sectional view showing a partial configuration of a shielding sheet 70 as a shielding member included in the magnetic field shield structure according to at least one embodiment of the present disclosure. Similar to the shielding sheet 60 according to the aforementioned embodiment, the shielding sheet 70 is provided with an opening 72 that opens to the magnetic field generation source side, that is, the lower side in FIG. 10. The rising portion 64 according to the aforementioned embodiment is not formed at the edge of the opening 72. The opening 72 is formed on the magnetic field generation source side (not shown), that is, the opening 72A formed on the lower pair layer 32A in FIG. 10, and the opening 72B formed on the intermediate pair layer 32B adjacent to the pair layer 32A. In the opening 72, the diameter of the opening 72A is set to be larger than the diameter of the opening 72B. In the opening 72, the cut surfaces of the pair layers 32A and 32B are exposed.

Also in this embodiment, the opening 72, as a notch formed in the shielding sheet 70, is open to the magnetic field generation source side. As a result, the opening 72 can effectively promote the drawing of the magnetic force lines to the sheet 34 having a high magnetic permeability of the pair layer 32C located at the opposite side to closest side to the magnetic field generation source. In addition, the sheet 36 having a low magnetic permeability of the pair layer 32C can block the transmission of the magnetic force lines LM. Further, magnetic lines of force can be drawn into each of the sheets 34 having a high magnetic permeability of the pair layers 32A and 32B from the cut surfaces of the pair layers 32A and 32B exposed in the openings 72. As a result, the efficiency of drawing the magnetic force lines into the shielding sheet 70 is improved.

Supplemental Description of Embodiment

Although the diameter of the opening 72A is set to be larger than the diameter of the opening 72B in the opening 72 in at least one embodiment, the present disclosure is not limited to this. For example, the diameter of the opening 72A and the diameter of the opening 72B may be set to be equal.

In addition, in at least one embodiment, the cut surfaces of the pair layers 32A and 32B are exposed in the opening 72 that is the notch, but the present disclosure is not limited to this. The present disclosure may be configured such that the cut surfaces of the paired layers 32A and 32B are not exposed. That is, for example, the present disclosure may be configured such that, when the notchs are formed linearly with respect to the pair layers 32A and 32B, the cut surfaces on both sides of the pair layers 32A and 32B through the notchs are arranged in contact with or close to each other.

Further, although the case in which the moving body is the vehicle 12 has been described in at least one embodiments, the present disclosure is not limited to this. The moving body in the present disclosure may be any one as long as the moving body is equipped with a magnetic field generation source and can carry an occupant. For example, the moving body in the present disclosure may be a flying body such as a multicopter, or a ship.

Further, in at least one embodiments, the case in which the magnetic field shield structure according to the present disclosure is applied to the vehicle 12 which is a moving body has been described, but the present disclosure is not limited to this. The present disclosure can be applied in order to shield the magnetic field from the magnetic field generation source provided in industrial machines and household appliances. Further, the magnetic field generation source in the present disclosure is not limited to the motor, and may be an inverter or high voltage wiring.

Further, in at least one embodiment, the motor 14, which is the magnetic field generation source, is mounted on the rear portion of the vehicle 12, but the configuration is not limited to this. The motor 14 may be mounted on the front portion of the vehicle 12 or the intermediate portion in the front-rear direction.

Further, in at least one embodiment, when viewed from the vehicle width direction, the center C of the notch 38 is located on the virtual straight line VL connecting the center M of the motor 14 and the hip point HP of the occupant P2, but the present disclosure is not limited to this. For example, the notch may be arranged between the magnetic field generation source and the occupant's head or chest.

In addition, the present disclosure can be embodied by being changed in various ways within a scope that does not depart from the gist thereof. Further, the scope of the right of the present disclosure is, of course, not to be limited to each of the above-aforementioned embodiment.

What is claimed is:

1. A magnetic field shielding structure, comprising:
    a magnetic field generating source configured to generate a magnetic field; and
    a shielding member that includes a pair of layers, the pair of layers including:
        a layer having high magnetic permeability, and
        a layer having low magnetic permeability laminated with the layer having high magnetic permeability, wherein the layer having high magnetic permeability is closer to the magnetic field generating source than the layer having low magnetic permeability.

2. The magnetic field shielding structure according to claim 1, wherein the shielding member includes a plurality of pairs of the layers, each of the plurality of pairs being laminated, and the pair of layers is one of the plurality of pairs of layers.

3. The magnetic field shielding structure according to claim 2, wherein the shielding member includes a notch on a side of the shielding member closest to the magnetic field generating source.

4. The magnetic field shielding structure according to claim 3, wherein a pair of layers, of the plurality of pairs of layers, which is farthest from the magnetic field generating source, does not include any part of the notch.

5. The magnetic field shielding structure according to claim 3, wherein, at the notch, cut surfaces of at least one pair of layers, of the plurality of pairs of layers, are exposed.

6. The magnetic field shielding structure according to claim 5, wherein, at the notch, the at least one pair of layers is bent toward the magnetic field generating source.

7. The magnetic field shielding structure according to claim 5, wherein a pair of layers, of the plurality of pair of layers, that is farthest from the magnetic field generating source does not include any part of the notch, and the notch opens toward the magnetic field generating source.

8. The magnetic field shielding structure according to claim 7, wherein the at least one pair of layers extends toward the magnetic field generating source at an end portion of the notch.

9. The magnetic field shielding structure according to claim 3, wherein:
    the magnetic field generating source comprises a motor; and
    the notch extends in a rotation axis direction of the motor.

10. The magnetic field shielding structure according to claim 1, wherein:
    the magnetic field generating source is mounted on a movable body configured to carry an occupant; and
    the shielding member is between a location for the occupant and the magnetic field generating source.

11. The magnetic field shielding structure according to claim 10, wherein:
    the movable body comprises a vehicle that is equipped with a seat for the occupant;
    the magnetic field generating source comprises a motor that is disposed diagonally downward of a vehicle rear of the seat with a vehicle width direction being a rotation axis direction of the motor; and
    the shielding member includes a plurality of pairs of the layers, each of the plurality of pairs being laminated, the pair of layers is one of the plurality of pairs of layers, and includes a notch on a side of the shielding member closest to the magnetic field generating source, wherein, as viewed from the vehicle width direction, the notch is on a virtual straight line that connects a center of the motor and a hip point of the occupant.

12. The magnetic field shielding structure according to claim 11, wherein the shielding member is curved so as to be concentric with an outer periphery of the motor.

13. The magnetic field shielding structure according to claim 1, wherein the shielding member is flexible.

14. The magnetic field shielding structure according to claim 1, wherein the layer having high magnetic permeability is a foil-like sheet comprising soft magnetic material.

15. The magnetic field shielding structure according to claim 1, wherein the layer having low magnetic permeability is a sheet comprising a non-magnetic material.

16. The magnetic field shielding structure according to claim 1, wherein the layer having high magnetic permeability is a sheet comprising a resin mixed with a fine powder of a soft magnetic material.

* * * * *